(12) United States Patent
Kline

(10) Patent No.: US 6,927,083 B2
(45) Date of Patent: *Aug. 9, 2005

(54) METHOD FOR CONSTRUCTING A WAFER-INTERPOSER ASSEMBLY

(75) Inventor: Jerry D. Kline, Argyle, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 10/771,796

(22) Filed: Feb. 2, 2004

(65) Prior Publication Data

US 2004/0166663 A1 Aug. 26, 2004

Related U.S. Application Data

(62) Division of application No. 09/707,873, filed on Nov. 7, 2000, now Pat. No. 6,686,657.

(51) Int. Cl.[7] .......................... H01L 21/66; G01R 31/28
(52) U.S. Cl. .......................... 438/17; 324/765; 438/113
(58) Field of Search .......................................... 438/17

(56) References Cited

U.S. PATENT DOCUMENTS

| | | |
|---|---|---|
| 3,939,558 A | 2/1976 | Riley |
| 4,577,214 A | 3/1986 | Schaper |
| 4,617,730 A | 10/1986 | Geldermans et al. |
| 4,628,411 A | 12/1986 | Balceres et al. |
| 4,688,151 A | 8/1987 | Kraus et al. |
| 4,868,712 A | 9/1989 | Woodman |
| 4,998,885 A | 3/1991 | Beaman |
| 5,016,138 A | 5/1991 | Woodman |
| 5,060,052 A | 10/1991 | Casto et al. |
| 5,065,227 A | 11/1991 | Frankeny et al. |
| 5,086,558 A | 2/1992 | Grube et al. |
| 5,123,850 A | 6/1992 | Elder et al. |
| 5,132,613 A | 7/1992 | Papae et al. |
| 5,148,265 A | 9/1992 | Khandros et al. |
| 5,148,266 A | 9/1992 | Khandros et al. |
| 5,222,014 A | 6/1993 | Lin |
| 5,309,021 A | 5/1994 | Shimamoto et al. |
| 5,327,325 A | 7/1994 | Nicewarner, Jr. |
| 5,347,159 A | 9/1994 | Khandros et al. |
| 5,347,162 A | 9/1994 | Pasch |
| 5,371,654 A | 12/1994 | Beaman et al. |
| 5,382,898 A | 1/1995 | Subramanian |
| 5,384,691 A | 1/1995 | Neugebauer et al. |
| 5,394,303 A | 2/1995 | Yamaji |
| 5,399,505 A | 3/1995 | Dasse et al. |
| 5,399,898 A | 3/1995 | Rostoker |
| 5,410,259 A | 4/1995 | Fujihara et al. |
| 5,440,241 A | 8/1995 | King et al. |

(Continued)

*Primary Examiner*—W. David Coleman
(74) *Attorney, Agent, or Firm*—Lawrence R. Youst; Danamraj & Youst, P.C.

(57) ABSTRACT

A method for reducing the likelihood of damaging a semiconductor wafer (18) and the integrated circuit chips of the semiconductor wafer (18) during handling utilizes a wafer interposer (12) having a wafer receiving portion (28) and a handling portion (30). The wafer receiving portion (28) of the wafer interposer (12) has a plurality of contact pads (22) that are electrically and non-temporarily mechanically connected to the contact pads of the integrated circuit chips of the wafer (18). The handling portion (30) of the wafer interposer (12) extends outwardly from the wafer receiving portion (28) such that the handling portion (30) is accessible to handling equipment without the handling equipment contacting the attached wafer (18).

26 Claims, 8 Drawing Sheets

U.S. PATENT DOCUMENTS

| | | |
|---|---|---|
| 5,476,211 A | 12/1995 | Khandros |
| 5,477,160 A | 12/1995 | Love |
| 5,483,421 A | 1/1996 | Gedney et al. |
| 5,489,804 A | 2/1996 | Pasch |
| 5,491,612 A | 2/1996 | Nicewarner, Jr. |
| 5,497,079 A | 3/1996 | Yamada et al. |
| 5,504,369 A | 4/1996 | Dasse et al. |
| 5,517,515 A | 5/1996 | Spall et al. |
| 5,518,964 A | 5/1996 | DiStefano et al. |
| 5,531,022 A | 7/1996 | Beaman et al. |
| 5,532,610 A | 7/1996 | Tsujide et al. |
| 5,532,612 A | 7/1996 | Liang |
| 5,544,017 A | 8/1996 | Beilin et al. |
| 5,548,223 A | 8/1996 | Cole et al. |
| 5,570,032 A | 10/1996 | Atkins et al. |
| 5,579,207 A | 11/1996 | Hayden et al. |
| 5,594,273 A | 1/1997 | Dasse et al. |
| 5,600,257 A | 2/1997 | Leas et al. |
| 5,600,541 A | 2/1997 | Bone et al. |
| 5,612,575 A | 3/1997 | DeGimy |
| 5,615,089 A | 3/1997 | Yoneda et al. |
| 5,635,101 A | 6/1997 | Pepe et al. |
| 5,637,920 A | 6/1997 | Loo |
| 5,654,588 A | 8/1997 | Dasse et al. |
| 5,655,290 A | 8/1997 | Moresco et al. |
| 5,685,885 A | 11/1997 | Khandros et al. |
| 5,701,666 A | 12/1997 | DeHaven et al. |
| 5,710,071 A | 1/1998 | Beddingfield et al. |
| 5,714,800 A | 2/1998 | Thompson |
| 5,759,047 A | 6/1998 | Brodsky et al. |
| 5,764,071 A | 6/1998 | Chan et al. |
| 5,764,655 A | 6/1998 | Kirbata et al. |
| 5,789,807 A | 8/1998 | Correale, Jr. |
| 5,794,175 A | 8/1998 | Conner |
| 5,796,746 A | 8/1998 | Farnworth et al. |
| 5,798,652 A | 8/1998 | Traci |
| 5,800,184 A | 9/1998 | Lopergolo et al. |
| 5,802,713 A | 9/1998 | Deamer |
| 5,805,422 A | 9/1998 | Otake et al. |
| 5,806,181 A | 9/1998 | Khandros et al. |
| 5,832,601 A | 11/1998 | Eldridge et al. |
| 5,834,844 A | 11/1998 | Akagawa et al. |
| 5,834,946 A | 11/1998 | Albrow et al. |
| 5,838,060 A | 11/1998 | Comer |
| 5,838,072 A | 11/1998 | Li et al. |
| 5,844,803 A | 12/1998 | Beffa |
| 5,848,467 A | 12/1998 | Khandros et al. |
| 5,854,507 A | 12/1998 | Miremadi et al. |
| 5,878,486 A | 3/1999 | Eldridge et al. |
| 5,885,849 A | 3/1999 | DiStefano et al. |
| 5,892,287 A | 4/1999 | Hoffman et al. |
| 5,897,326 A | 4/1999 | Eldridge et al. |
| 5,900,738 A | 5/1999 | Khandros et al. |
| 5,905,382 A | 5/1999 | Wood et al. |
| 5,915,752 A | 6/1999 | DiStefano et al. |
| 5,927,193 A | 7/1999 | Balz et al. |
| 5,929,651 A | 7/1999 | Leas et al. |
| 5,936,847 A | 8/1999 | Kazle |
| 5,942,246 A | 8/1999 | Mayhew et al. |
| 5,943,213 A | 8/1999 | Sasov |
| 5,949,246 A | 9/1999 | Frankeny et al. |
| 5,950,070 A | 9/1999 | Razon et al. |
| 5,950,304 A | 9/1999 | Khandros et al. |
| 5,959,462 A | 9/1999 | Lum |
| 5,977,640 A | 11/1999 | Bertin et al. |
| 5,984,691 A | 11/1999 | Brodsky et al. |
| 6,002,178 A | 12/1999 | Lin |
| 6,013,944 A | 1/2000 | Moriya et al. |
| 6,018,462 A | 1/2000 | Sakuyama |
| 6,024,275 A | 2/2000 | Takiar |
| 6,032,356 A | 3/2000 | Eldridge et al. |
| 6,034,332 A | 3/2000 | Moresco et al. |
| 6,046,600 A | 4/2000 | Whetsel |
| 6,049,467 A | 4/2000 | Tamarkin et al. |
| 6,050,829 A | 4/2000 | Eldridge et al. |
| 6,053,395 A | 4/2000 | Sasaki |
| 6,064,213 A | 5/2000 | Khandros et al. |
| 6,069,026 A | 5/2000 | Terrill et al. |
| 6,080,264 A | 6/2000 | Ball |
| 6,080,494 A | 6/2000 | Abbott |
| 6,082,610 A | 7/2000 | Shangguan et al. |
| 6,083,773 A | 7/2000 | Lake |
| 6,098,278 A | 8/2000 | Vindasius et al. |
| 6,101,100 A | 8/2000 | Londa |
| 6,104,202 A | 8/2000 | Slocum et al. |
| 6,133,070 A | 10/2000 | Yagi et al. |
| 6,136,681 A | 10/2000 | Razon et al. |
| 6,137,299 A | 10/2000 | Cadieux et al. |
| 6,147,400 A | 11/2000 | Faraci et al. |
| 6,154,371 A | 11/2000 | Oba et al. |
| 6,161,205 A | 12/2000 | Tuttle |
| 6,190,940 B1 | 2/2001 | DeFelice et al. |
| 6,218,910 B1 | 4/2001 | Miller |
| 6,229,216 B1 | 5/2001 | Ma et al. |
| 6,242,279 B1 | 6/2001 | Ho et al. |
| 6,242,932 B1 | 6/2001 | Hembree |
| 6,246,247 B1 | 6/2001 | Eldridge et al. |
| 6,275,051 B1 | 8/2001 | Bachelder et al. |
| 6,281,046 B1 | 8/2001 | Lam |
| 6,297,553 B1 | 10/2001 | Horiuchi et al. |
| 6,303,992 B1 | 10/2001 | Van Pham et al. |
| 6,313,522 B1 | 11/2001 | Akram et al. |
| 6,319,829 B1 | 11/2001 | Pasco et al. |
| 6,331,782 B1 | 12/2001 | White et al. |
| 6,376,769 B1 | 4/2002 | Chung |
| 6,392,428 B1 | 5/2002 | Kline et al. |
| 6,432,744 B1 | 8/2002 | Amador et al. |
| 6,440,771 B1 | 8/2002 | Pierce |
| 6,483,043 B1 | 11/2002 | Kline |
| 6,483,330 B1 | 11/2002 | Kline |
| 6,524,885 B2 | 2/2003 | Pierce |
| 6,529,022 B2 | 3/2003 | Pierce |
| 6,537,831 B1 | 3/2003 | Kline |
| 6,627,998 B1 | 9/2003 | Caletka et al. |
| 6,673,653 B2 | 1/2004 | Pierce |
| 6,686,657 B1 | 2/2004 | Kline |
| 6,717,819 B1 | 4/2004 | Chung |
| 6,759,741 B2 | 7/2004 | Kline |
| 6,812,048 B1 * | 11/2004 | Kline .......................... 438/17 |
| 6,815,712 B1 | 11/2004 | Kline |
| 6,822,469 B1 | 11/2004 | Kline |
| 2002/0011663 A1 | 1/2002 | Khandros et al. |

\* cited by examiner

METHOD FOR CONSTRUCTING A WAFER-INTERPOSER ASSEMBLY

CROSS-REFERENCE TO RELATED APPLICATION

This is a divisional application of application Ser. No. 09/707,873, entitled "Interposer for Improved Handling of Semiconductor Wafers and Method of Use of Same," filed on Nov. 7, 2000 in the name of Jerry D. Kline, now U.S. Pat. No. 6,686,657.

TECHNICAL FIELD OF THE INVENTION

The present invention relates in general to handling semiconductor wafers and, more particularly, to an improved method of handling semiconductor wafers during processing, testing, storing and transporting wherein a wafer is attached to a wafer interposer to form a wafer-interposer assembly that reduces the risk of damage to the wafer and the associated integrated circuit chips.

BACKGROUND OF THE INVENTION

Modern electronic devices utilize integrated circuits, commonly referred to as "chips," which incorporate numerous electronic elements. These chips are typically manufactured in a wafer format, in which numerous similar devices, known as "die" are constructed on a base made from a silicon ingot. In the past, small diameter wafers were common. Today, however, larger diameter wafers, including wafers having an eight-inch diameter (200 mm) and wafers having a twelve-inch diameter (300 mm) are typical. In addition to the increase in the diameter of the wafers, there has been a dramatic increase in the density of the circuitry on the wafers. As such, modern wafers may contain hundreds if not thousands of die making each wafer highly valuable.

It has been found, however, that the high density circuitry on these larger wafers has an increased susceptibility to stress, vibration and abrasion. In addition, it has been found, that the larger diameter wafers have an increased susceptibility to cracking and breaking. Thus, conventional handling procedures during processing, testing, storage and transportation of wafers have resulted in damage to individual die as well as to entire wafers.

As an example, during wafer level testing using a prober test machine, the wafer must be handled numerous times. These handling steps include loading the wafer onto a tray of the prober test machine using a transfer arm, picking up the wafer with a vacuum pick up device from the tray and placing it into a cassette slot and loading the cassette onto an autoloader which transfers the wafer to a stage using a transfer arm. Once on the stage, the die on the wafer are tested using the prober that must physically contact each die. After testing the transfer arm removes the wafer from the stage and returns it to the cassette. This procedure is repeated for each of the wafers to be tested.

As can be seen, the wafer must be moved numerous times during this testing process by transfer equipment such as transfer arms and vacuum pick up devices. During such movements, the wafer is subjected to numerous potential hazards. For example, if a disruption occurs during a vacuum transfer of a wafer, the wafer may be dropped resulting in cracking or breaking of the wafer. Alternatively, if the wafer is not properly positioned in the cassette, the wafer may fall out. Similarly, if the wafer is not properly aligned within the prober test machine, the prober may damage one or more die. In addition to damaging the wafer, if a wafer is dropped, it can damage processing equipment causing machine down time and maintenance costs. For example, if a wafer breaks, it leaves behind fine silicon particles which must be removed from the processing equipment to avoid causing microscratches on other wafers.

In a like manner, each wafer must be handled numerous times during other steps of wafer processing. In fact, some of the wafer processing steps may occur at different facilities which require placing the wafers in containers and shipping the wafers to another location. In this case, the wafers are typically picked up by a vacuum pick up device and lowered into a container. Again, this process raises the possibility of dropping and breaking the wafer. If the wafer is dropped directly onto another wafer in the container, for example, both wafers may be scratched, cracked or broken.

Therefore, a need has arisen for an improved method for handling wafers during wafer processing, testing, storing and transporting. A need has also arisen for such a method that reduces the likelihood for scratching, cracking, breaking or otherwise damaging a wafer when the wafer must be handled. A need has further arisen for such a method that reduces the likelihood of vibration, abrasion or other stress being placed on the die of the wafer.

SUMMARY OF THE INVENTION

The present invention disclosed herein comprises an apparatus and method for improved handling of wafers during wafer processing, testing, storing and transporting. The method and apparatus of the present invention reduce the likelihood for scratching, cracking, breaking or otherwise damaging a wafer when the wafer must be handled. In addition, the method and apparatus of the present invention reduce the likelihood of vibration, abrasion or other stress being placed on the integrated circuit chips of the wafer.

The present invention comprises a wafer-interposer assembly that includes a wafer that is attached to a wafer interposer. The wafer has a plurality of integrated circuit chips each having a plurality of contact pads. These contact pads are electrically connected to a plurality of contact pads on a wafer interposer using, for example, conductive attachment elements. The wafer interposer has a wafer receiving portion and a handling portion. The wafer receiving portion includes the plurality of contact pads that correspond to the contact pads of the integrated circuit chips. The handling portion of the wafer interposer extends outwardly from the wafer receiving portion such that the handling portion is accessible without contacting a wafer in position in the wafer receiving portion. Specifically, the handling portion allows for the manual or automated transfer of the wafer-interposer assembly from one location to another without contact with the wafer. In addition, the wafer-interposer assembly allows for testing of the integrated circuit chips on the wafer without contact with the wafer.

The handling portion of the wafer interposer may take any suitable configuration that improves the handling of the wafer by reducing the likelihood of damaging the wafer. Such configurations may include having a surface area that extends beyond the perimeter of the wafer. Likewise, such configurations may include having a slot, a rail, a hole, a magnet, a set of bearing or the like that interact with transfer or processing equipment to allow secure relocation and position identification of the wafer. Alternatively or additionally, the handling portion of the wafer interposer may include a receiving member attached thereto, such as a handle or an eyelet, to reduce the likelihood of dropping the wafer during movement. The handling portion of the wafer interposer may also include a locking member that interacts, for example, with test equipment to releasably secure the wafer in the proper position. To further protect the wafer and the integrated circuits on the wafer from bending and vibration, the wafer interposer may include one or more stiffeners. Similarly, to protect the wafer and the integrated circuits on the wafer from shock, the wafer interposer may have cushioning members attached thereto. Additionally, to even further protect the wafer and the integrated circuits on the wafer, a cover may be removably attached to the handling portion of the wafer interposer to enclose the wafer thereunder.

In the method of the present invention, the likelihood of damaging a wafer during handling is reduced by electrically connecting the wafer to a wafer interposer that has a wafer receiving portion and a handling portion, thus allowing access to the handling portion of the wafer interposer without contacting the wafer. This method may include accessing a slot, a rail, a hole, a receiving member, a set of bearings or the like of the handling portion of the wafer interposer. The method may also include positioning the wafer by determining the location of a magnet of the handling portion of the wafer interposer. Further, the method may include securing the wafer in a predetermined location by operating a locking member in the handling portion of the wafer interposer. The method may additionally or alternatively include preventing bending, vibrating or shocking the wafer through the use of a stiffener in the handling portion of the wafer interposer, by disposing a cushioning member around at least part of the handling portion of the wafer interposer and by removably attaching a cover to the handling portion of the wafer interposer that extends across the wafer receiving portion.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not define the scope of the invention.

Figure 1:
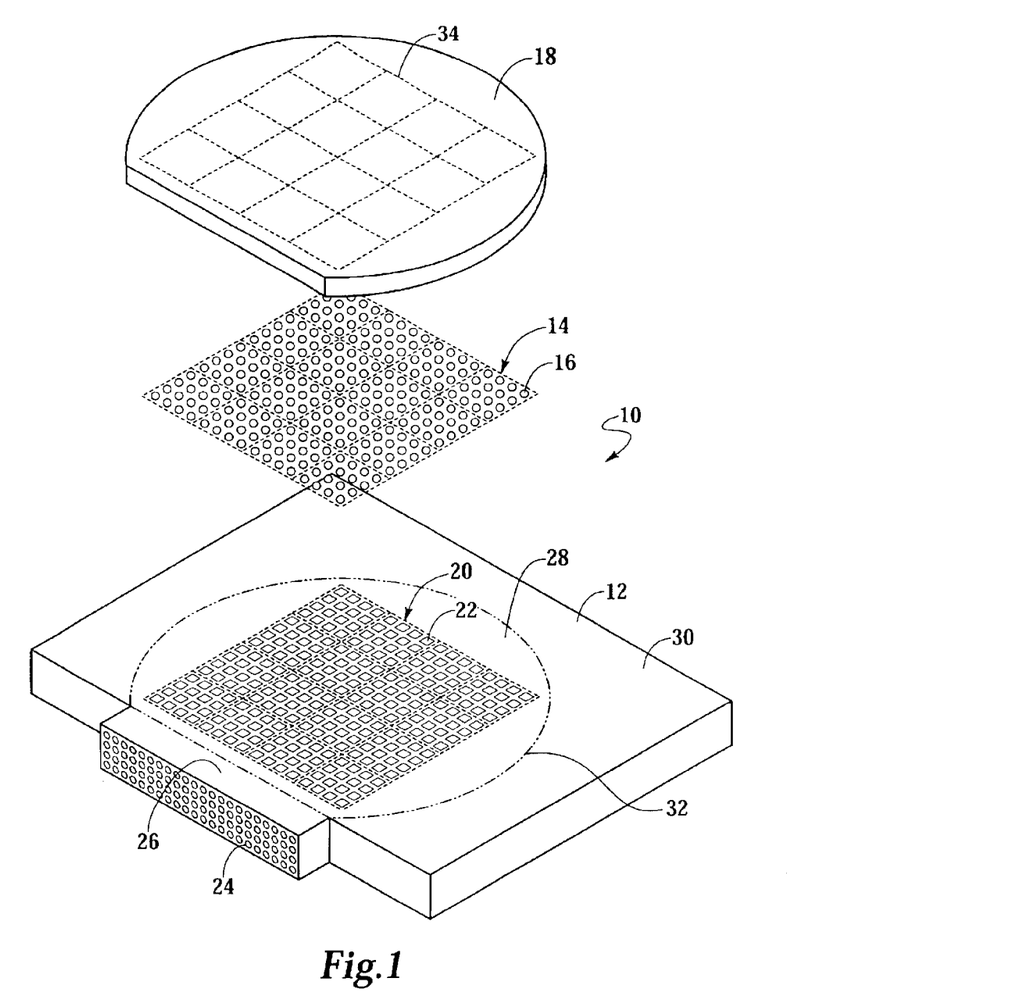
FIG. 1 is an exploded view of a wafer-interposer assembly of the present invention.

The features of a wafer-interposer assembly of the present invention are shown in FIG. 1 and are generally designated 10. Wafer-interposer assembly 10 includes a wafer interposer 12, an array 14 of conductive attachment elements 16 and a wafer 18. Interposer 12 has an array 20 of conductive contact pads 22 on the upper surface thereof. Array 20 is split into sixteen sections separated by dotted lines. The dotted lines represent the locations where interposer 12 will be cut when interposer 12 is diced into chip assemblies, including a section of interposer 12 and an associated chip from wafer 18, as will be described in more detail below. It should be noted that while array 20 of interposer 12 is depicted as having sixteen sections in FIG. 1, this depiction is for simplicity and clarity of description as those skilled in the art will recognize that actual interposers may have several hundred or several thousand sections which correspond to the several hundred or several thousand chips on typical wafers.

Each of the sixteen sections of array 20 has sixteen contact pads 22 depicted therein. Each contact pad 22 represents a location where interposer 12 is electrically connected to a contact pad on a chip of wafer 18. It should be noted that while sixteen contact pads 22 are depicted in each section of array 20 in FIG. 1, this depiction is for simplicity and clarity of description as those skilled in the art will recognize that the actual number of contact pads 22 in each section may be several hundred or several thousand.

On the lower surface of interposer 12 there is an array of conductive contact pads (not pictured), some of which are electrically connected to contact pads 22 by routing lines and vias that traverse the various layers interposer 12. These contact pads will be used to attach the chip assemblies singulated from wafer-interposer assembly 10 to a substrate as will be explained in greater detail below. In addition, there is a set of testing conductors (not pictured) that pass through interposer 12 and connect some of the contact pads 22 to test elements, depicted as test sockets 24 of testing connector 26.

It should be noted that the contact pads on the lower surface of interposer 12 may have an identical geometry as contact pads 22. The present invention, however, is by no means limited to having identical geometries. As each die design may have unique pad geometry, one of the advantages of the present invention is that the contact pads on the lower surface of an interposer may utilize a geometry that is different from that of the contact pads of the chips. Traditionally, chip designers have been limited in chip layout in that all of the I/O of a chip had to be made either at the peripheral edges of the chip (for wire bonding) or at least in a standard pin or pad layout defined by a standardization body, such as the Joint Electrical Dimensional Electronic Committee (JEDEC). The interconnection requirements, therefore, have traditionally driven the chip layout. Chip designs for use with an interposer of the present invention are not limited by such constraints.

In addition, it should be noted by those skilled in the art that directional terms, such as above, below, upper, lower, etc., are used for convenience in referring to the accompanying drawings as it is to be understood that the various embodiments of the present invention described herein may be utilized in various orientations, such as inclined, inverted, horizontal, vertical, etc., without departing from the principles of the present invention.

Interposer 12 includes a wafer receiving portion 28 and a handling portion 30. A dotted line 32, which substantially coincides with an outline of the perimeter of wafer 18, has been added to FIG. 1 to show the location of wafer receiving portion 28. The remaining area of interposer 12 can be considered the handling portion 30 of interposer 12. Interposer 12 is designed such that wafer-interposer assembly 10 may be moved from one location to another, be placed in and removed from a container or be stored without contact being made with wafer 18 by processing equipment, handling equipment, containers or other wafers. As such, interposer 12 reduces the likelihood that wafer 18 will become damaged.

Disposed between interposer 12 and wafer 18 is array 14 of conductive attachment elements 16. Array 14 is split into sixteen sections separated by dotted lines. Each of the sections has sixteen conductive attachment elements 16 that correspond to contact pads 22 of interposer 12. Conductive attachment elements 16 may be in the shape of balls, bumps, columns, stud and the like. Conductive attachment elements 16 may be formed from any suitable electrically conductive material such as solder, including tin based solder, gold based solder, zinc based solder, indium based solder and the like. Alternatively, conductive attachment elements 16 may be formed from a conductive epoxy, a conductive polymer, such as a silver filled polymer, or the like. Conductive attachment elements 16 may be attached to interposer 12 by any number of attachment techniques including screening, flowing, molding, reflowing, dipping, electroplating, adhering and the like, depending upon which material is used for conductive attachment elements 16.

It should be understood by those skilled in the art that even though FIG. 1 has depicted conductive attachment elements 16 as coupling wafer 18 and interposer 12, other methods for electrically coupling interposer 12 and wafer 18 may be utilized and are considered within the scope of the present invention including, for example, having studs molded directly to interposer 12.

Wafer 18 includes a plurality of chips (not pictured) on the lower surface thereof. Depicted on the upper surface of wafer 18 are dotted lines which represent the location of the kerf 34 between die where wafer 18 will be cut when wafer 18 and interposer 12 are singulated into chip assemblies, as will be described in more detail below. In the illustrated embodiment, wafer 18 is depicted as having sixteen die. This depiction is for simplicity and clarity of description as those skilled in the art will recognize that the actual number of die on wafer 18 may be several hundred or several thousand.

Each of the die on wafer 18 has a plurality of conductive contact pads that, after assembly, are electrically connected and mechanically bonded to contact pads 22 of interposer 12 by conductive attachment elements 16. These permanent electrical and mechanical connections may be achieved using, for example, a heating method such as reflowing or thermal compression.

As such, wafer-interposer assembly 10 allows for improved handling of wafer 18 by protecting the die on the lower surface of wafer 18 from vibration, abrasion or other stress and by reducing the likelihood of scratching, cracking, breaking or otherwise damaging wafer 18 by minimizing contact between wafer 18 and processing equipment, handling equipment and other hazards. Importantly, the face down mounting of wafer 18 to wafer interposer 12 protects the die on wafer 18 from being contacted by processing or handling equipment. For example, wafer level testing of wafer 18 may now be performed without contacting the die on wafer 18 or any other part of wafer 18 either by handling equipment or test probes. Specifically, wafer 18 is connected to a testing apparatus using handling equipment that moves wafer 18 into the proper position but only contacts interposer 12 in handling portion 30. Handling equipment may contact, grip, hold, push, pull or otherwise access interposer 12 without touching wafer 18. As interposer 12 is not as delicate as wafer 18, handling may now be accomplished using handling equipment that is more robust and more reliable but less sophisticated and less expensive than typical wafer handling systems. For example, more powerfully vacuum pickup devices may be used to create suction against wafer interposer 12 rather than wafer 18.

It should be noted that because handling does not involve contact with wafer 18, additional real estate on wafer 18 may now contain die, thereby increasing the total number of die per wafer as well as the value of wafer 18. Also, it should be noted that since wafer-interposer assembly 10 is eventually diced into chip assemblies, sections of wafer interposer 12, including handling portion 30, part of wafer receiving portion 28 and test connector 26 will not be part of the chip assemblies. As such, certain parts of wafer interposer 12, such as test connector 26 may be reused with other wafer interposers.

Regarding testing of the die on wafer 18, this is accomplished via test sockets 24 of testing connector 26. This removes the need to physically contact the various die with probes. Specifically, the testing may include a complete parametric test, a burn-in or whatever subsets thereof are deemed necessary for that particular chip design. During the course of testing, signals may be sent to individual die, groups of die or all of the die to test each function of the die which may ideally occur across a range of conditions, such as temperature variations and vibration, to simulate real world operation.

Figure 2:
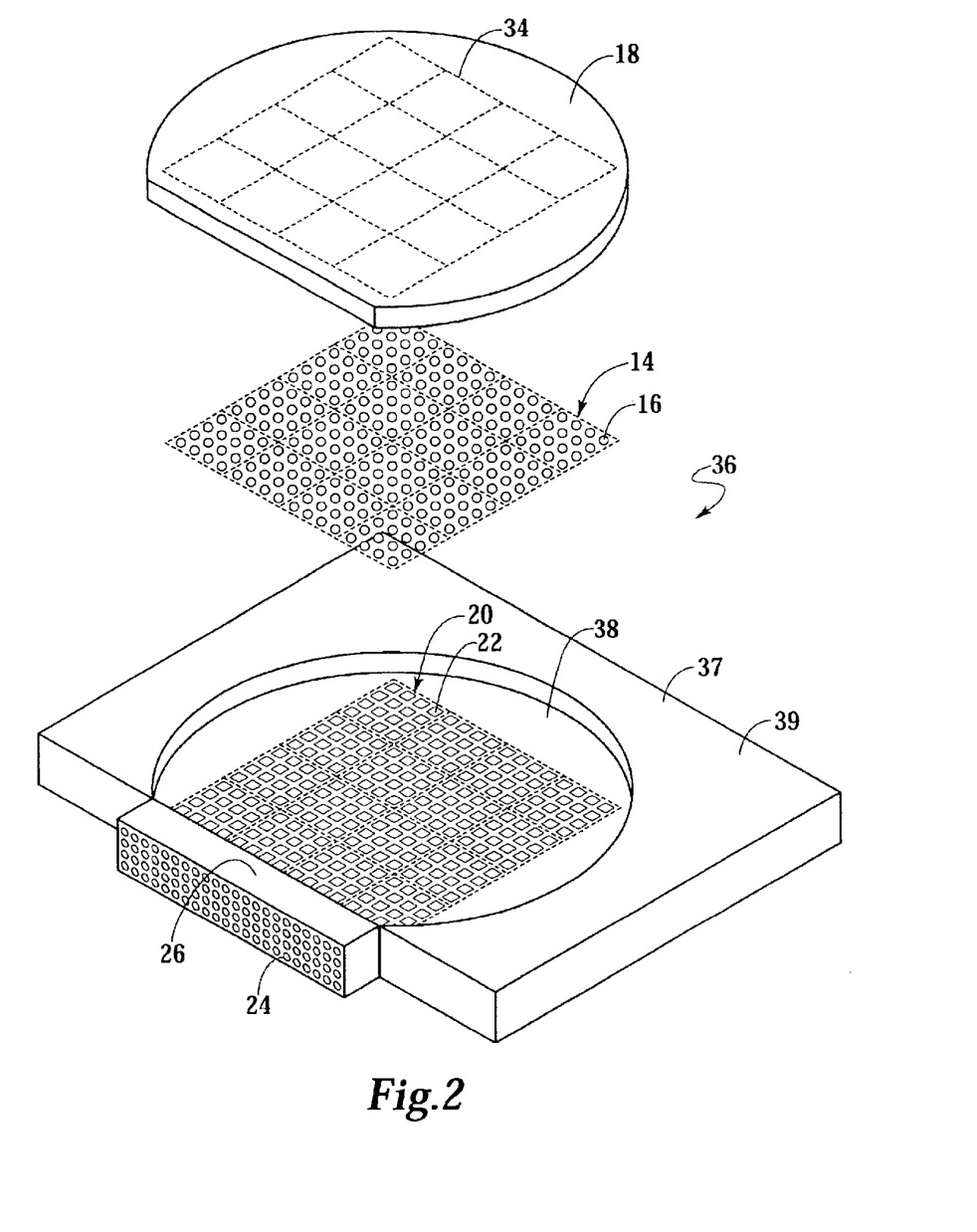
FIG. 2 is an exploded view of a wafer-interposer assembly of the present invention.

Referring now to FIG. 2, therein is depicted a wafer-interposer assembly of the present invention that is generally designated 36. Wafer-interposer assembly 36 includes a wafer interposer 37 and a wafer 18 that is electrically and mechanically attachable to interposer 37 as explained above. Wafer interposer 37 includes a wafer receiving portion 38 that is recessed into wafer interposer 37. Wafer interposer 37 also includes a handling portion 39 that extends outwardly from wafer receiving portion 38 such that handling portion 39 is accessible without contacting wafer 18. In the illustrated embodiment, when the contact pads on the chips of wafer 18 are attached to contact pads 22 of wafer interposer 37, wafer 18 may be partially disposed within wafer interposer 37, the top surface of wafer 18 may be flush with top surface of wafer interposer 37 or the top surface of wafer 18 may be below the top surface of wafer interposer 37. In any such configuration, wafer interposer 37 provides added security to wafer 18 by minimizing to potential for contact with wafer 18 during handling. Importantly, as wafer 18 is mounted to wafer interposer 37 with the die face down, the protection provided to the die by this embodiment is further enhanced.

Figure 3:
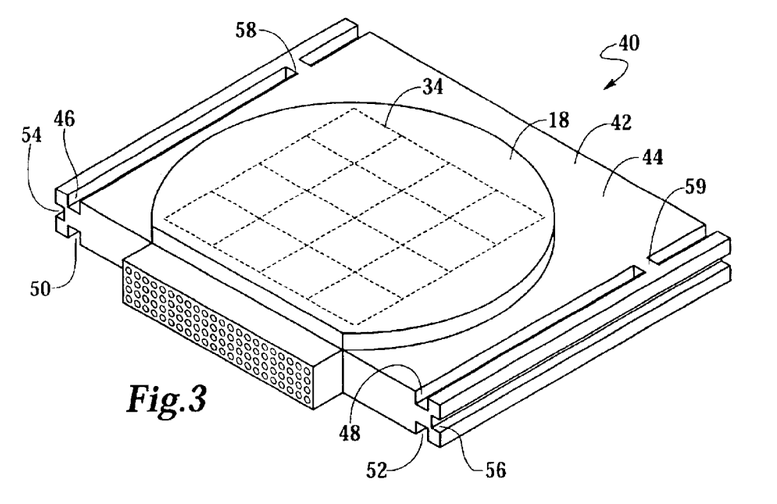
FIG. 3 is an isometric view of a wafer-interposer assembly of the present invention having channels to improve the handling of the wafer.

Referring now to FIG. 3, therein is depicted a wafer-interposer assembly of the present invention that is generally designated 40. Wafer-interposer assembly 40 includes a wafer interposer 42 and a wafer 18 that is electrically and mechanically attached thereto as explained above. Wafer interposer 42 includes a wafer receiving portion onto which wafer 18 has been positioned and a handling portion 44 that extends outwardly from the wafer receiving portion such that handling portion 44 is accessible without contacting wafer 18. In the illustrated embodiment, handling portion 44 includes a plurality of slots that provide for the use of highly reliable handling equipment for moving wafer-interposer assembly 40 from one location to another and provide for secure positioning of wafer-interposer assembly 40 within processing equipment, containers and the like. Specifically, handling portion 44 of interposer 42 has a pair of upper slots 46 and 48, a pair of lower slots 50 and 52 and a pair of side slots 54 and 56. As an example, these slots provide for the secure insertion and proper alignment of wafer-interposer assembly 40 into a testing apparatus. In addition slots 46 and 48 include stops 58 and 59, respectively, that assure proper orientation and positioning of wafer-interposer assembly 40 into, for example, testing equipment. Likewise, these slots provide for the secure insertion of wafer-interposer assembly 40 into a cassette type transfer container or secure insertion or stacking within a storage/transportation container. In any of the above examples, wafer-interposer assembly 40 may be moved using transfer equipment that securely accesses one or more of the slots or other parts of handling portion 44.

Even though FIG. 3 has depicted interposer 42 as having three pairs of slots, upper slots 46 and 48, a pair of lower slots 50 and 52 and a pair of side slots 54 and 56, it should be understood by those skilled in the art that interposer 42 could have other numbers of slots, either more or less, depending upon the configuration of the transfer or processing equipment or the containers to be used in conjunction with wafer-interposer assembly 40, without departing from the principles of the present invention. In addition, even though FIG. 2 has depicted the slots of interposer 42 as traversing the entire length of interposer 42, it should be understood by those skilled in the art that interposer 42 could alternatively have slots that extend only part way across interposer 42, without departing from the principles of the present invention. Also, even though FIG. 3 has depicted slots that are symmetrically cut into interposer 42, non symmetrically positioned slots may alternatively be used without departing from the principles of the present invention.

Figure 4:
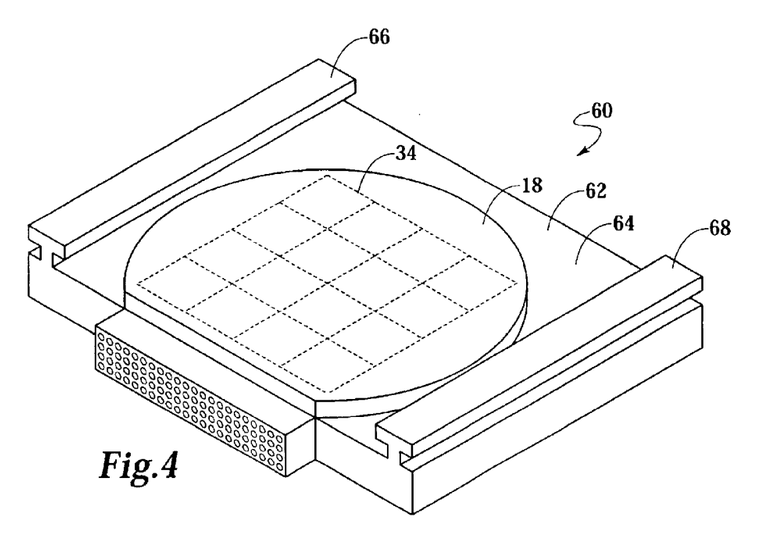
FIG. 4 is an isometric view of a wafer-interposer assembly of the present invention having rails to improve the handling of the wafer.

Referring next to FIG. 4, therein is depicted a wafer-interposer assembly of the present invention that is generally designated 60. Wafer-interposer assembly 60 includes a wafer interposer 62 and a wafer 18 that is electrically and mechanically attached thereto as explained above. Wafer interposer 62 includes a wafer receiving portion onto which wafer 18 has been positioned and a handling portion 64 that extends outwardly from the wafer receiving portion such that handling portion 64 is accessible without contacting wafer 18. In the illustrated embodiment, handling portion 64 includes a pair of rails 66 and 68 that provide for the use of highly reliable handling equipment and provide for secure positioning of wafer-interposer assembly 60 using transfer equipment that securely accesses rails 66 and 68 or other parts of handling portion 64.

Even though FIG. 4 has depicted interposer 62 as having two rails 66 and 68 on the upper surface or interposer 62, it should be understood by those skilled in the art that interposer 62 could additionally or alternatively have rails located in other positions or configuration on handling portion 64 such as on the lower surface, the sides or the end of interposer 62, without departing from the principles of the present invention. Also, even though FIG. 4 has depicted rails that are integral with interposer 62, removeable rails could alternatively be used to facilitate reuse.

Figure 5:
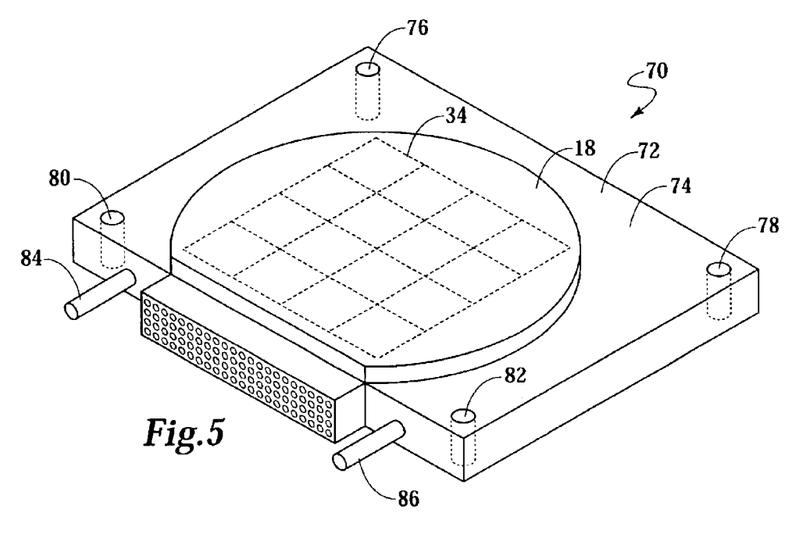
FIG. 5 is an isometric view of a wafer-interposer assembly of the present invention having holes to improve the handling of the wafer.

Referring to FIG. 5, therein is depicted a wafer-interposer assembly of the present invention that is generally designated 70. Wafer-interposer assembly 70 includes a wafer interposer 72 and a wafer 18 that is electrically and mechanically attached thereto as explained above. Wafer interposer 72 includes a wafer receiving portion onto which wafer 18 has been positioned and a handling portion 74 that extends outwardly from the wafer receiving portion such that handling portion 74 is accessible without contacting wafer 18. In the illustrated embodiment, handling portion 74 includes four holes 76, 78, 80 and 82 that provide for the use of highly reliable handling equipment and provide for accurate positioning of wafer-interposer assembly 70 using transfer equipment that securely accesses holes 76, 78, 80 and 82 or other parts of handling portion 74. In addition, handling portion 74 includes a pair of alignment pins 84 and 86 that provide protection against misalignment of wafer-interposer assembly 70.

Even though FIG. 5 has depicted interposer 72 as having four holes 76, 78, 80 and 82 in the respective corners of interposer 72, it should be understood by those skilled in the art that interposer 72 could include other numbers of holes, either more or less, in other positions in handling portion 74, without departing from the principles of the present invention. Also, even though the holes have been depicted as being symmetric, the holes could alternatively be positioned in a non symmetric orientation without departing from the principles of the present invention.

Figure 6:
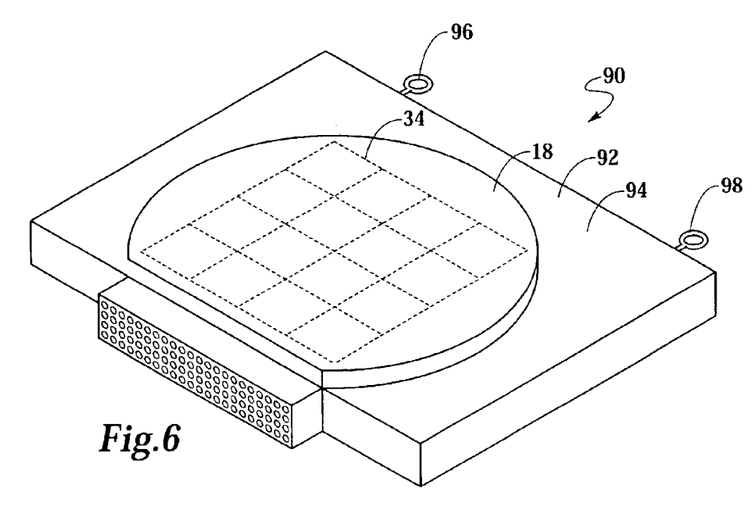
FIG. 6 is an isometric view of a wafer-interposer assembly of the present invention having receiving members to improve the handling of the wafer.

Now referring to FIG. 6, therein is depicted a wafer-interposer assembly of the present invention that is generally designated 90. Wafer-interposer assembly 90 includes a wafer interposer 92 and a wafer 18 that is electrically and mechanically attached thereto as explained above. Wafer interposer 92 includes a wafer receiving portion onto which wafer 18 has been positioned and a handling portion 94 that extends outwardly from the wafer receiving portion such that handling portion 94 is accessible without contacting wafer 18. In the illustrated embodiment, handling portion 94 includes a pair of receiving members 96 and 98 extended outwardly therefrom that provide for the use of highly reliable handling equipment to pull, carry, move or otherwise access handling portion 94 of interposer 92.

Even though FIG. 6 has depicted interposer 92 as having two receiving members 96 and 98 positioned on the end of interposer 92, it should be understood by those skilled in the art that interposer 92 could have other numbers of receiving members, either more or less, in other positions on handling portion 94, without departing from the principles of the present invention.

Figure 7:
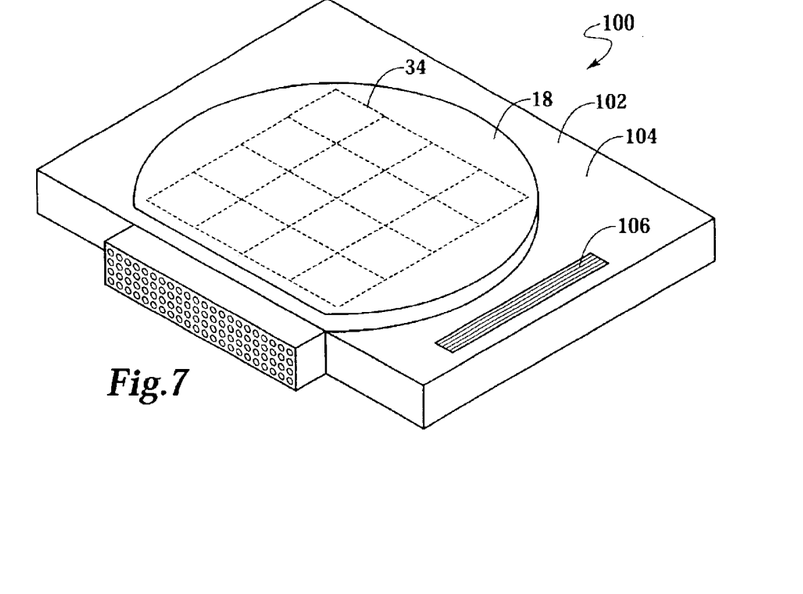
FIG. 7 is an isometric view of a wafer-interposer assembly of the present invention having a magnetic strip to improve the handling of the wafer.

Referring next to FIG. 7, therein is depicted a wafer-interposer assembly of the present invention that is generally designated 100. Wafer-interposer assembly 100 includes a wafer interposer 102 and a wafer 18 that is electrically and mechanically attached thereto as explained above. Wafer interposer 102 includes a wafer receiving portion onto which wafer 18 has been positioned and a handling portion 104 that extends outwardly from the wafer receiving portion such that handling portion 104 is accessible without contacting wafer 18. In the illustrated embodiment, handling portion 104 has a magnet strip 106 positioned thereon that provides for the use of magnetic pick up equipment or magnetic position identification of interposer 102 and wafer 18 attached thereto.

Even though FIG. 7 has depicted interposer 102 as having a single magnetic strip 106, it should be understood by those skilled in the art that interposer 102 could alternatively have multiple magnetic strips or magnets of other shape and configuration, without departing from the principles of the present invention.

Figure 8:
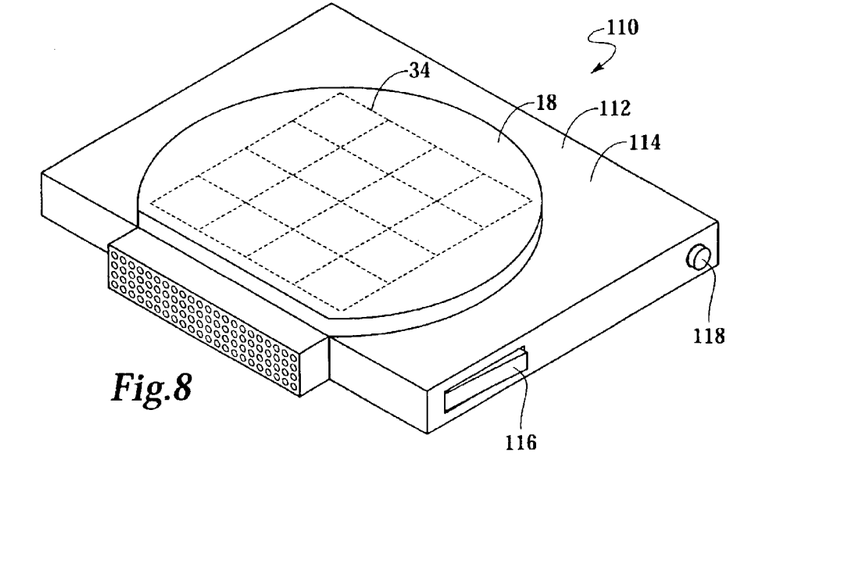
FIG. 8 is an isometric view of a wafer-interposer assembly of the present invention having a locking mechanism to improve the handling of the wafer.

Referring now to FIG. 8, therein is depicted a wafer-interposer assembly of the present invention that is generally designated 110. Wafer-interposer assembly 110 includes a wafer interposer 112 and a wafer 18 that is electrically and mechanically attached thereto as explained above. Wafer interposer 112 includes a wafer receiving portion onto which wafer 18 has been positioned and a handling portion 114 that extends outwardly from the wafer receiving portion such that handling portion 114 is accessible without contacting wafer 18. In the illustrated embodiment, handling portion 114 includes a pair of locking members 116, only one of which is seen, that are used to secure wafer-interposer assembly 110 within, for example, processing equipment or containers. In addition, handling portion 114 includes a pair of release members 118, only one of which is seen, that are used to disengage locking members 116 and release wafer-interposer assembly 110 from processing equipment or containers. Alternatively, other types of devices for securing wafer-interposer assembly 110 in place may be used including but not limited to, jack screws, wedge locks and the like, without departing from the principles of the present invention.

Figure 9:
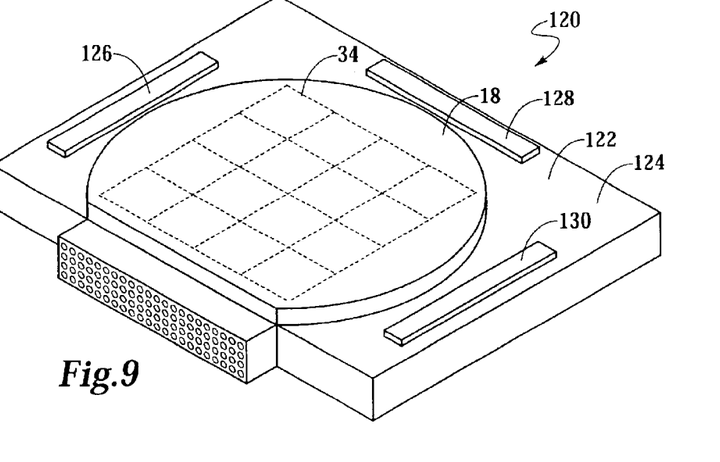
FIG. 9 is an isometric view of a wafer-interposer assembly of the present invention having stiffening members to improve the handling of the wafer.

Referring now to FIG. 9, therein is depicted a wafer-interposer assembly of the present invention that is generally designated 120. Wafer-interposer assembly 120 includes a wafer interposer 122 and a wafer 18 that is electrically and mechanically attached thereto as explained above. Wafer interposer 122 includes a wafer receiving portion onto which wafer 18 has been positioned and a handling portion 124 that extends outwardly from the wafer receiving portion such that handling portion 124 is accessible without contacting wafer 18. In the illustrated embodiment, handling portion 124 has three stiffening members 126, 128 and 130 positioned thereon that provides extra strength to interposer 122 such that bending and vibration of wafer 18 may be minimized during movement of wafer-interposer assembly 120. Using this embodiment of the present invention as well as other embodiment of the present invention thinner, more fragile wafers may be processed. As the stress on wafer 18 is reduced, the thickness of wafer 18 may also be reduced, thereby increasing the number of wafers that may be produced from a single ingot of silicon.

Even though FIG. 9 has depicted interposer 122 as having a three stiffening members 126, 128 and 130, it should be understood by those skilled in the art that interposer 122 could alternatively have a different number of stiffening members, either more or less, without departing from the principles of the present invention. In addition, it should be noted that while stiffening members 126, 128 and 130 have been depicted as being fixably mounted on handling portion 124 of interposer 122, stiffening members could alternatively be embedded within handling portion 124 of interposer 122 or may be removable from handling portion 124 to facilitate reuse.

Figure 10:
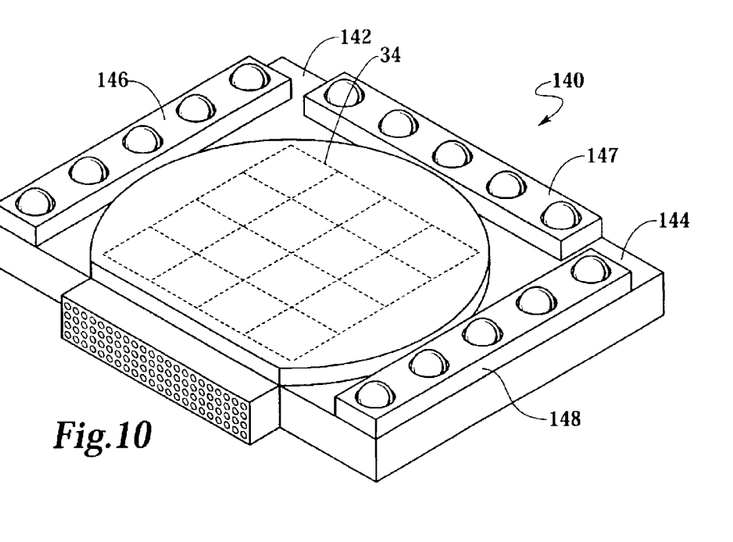
FIG. 10 is an isometric view of a wafer-interposer assembly of the present invention having bearings to improve the handling of the wafer.

In FIG. 10, a wafer-interposer assembly of the present invention that is generally designated 140 is depicted. Wafer-interposer assembly 140 includes a wafer interposer 142 and a wafer 18 that is electrically and mechanically attached thereto as explained above. Wafer interposer 142 includes a wafer receiving portion onto which wafer 18 has been positioned and a handling portion 144 that extends outwardly from the wafer receiving portion such that handling portion 144 is accessible without contacting wafer 18. In the illustrated embodiment, handling portion 144 has three sets of ball bearings 146, 147 and 148 that are rotatably positioned in handling portion 144 that provides for ease in movement of wafer-interposer assembly 140.

Figure 11:
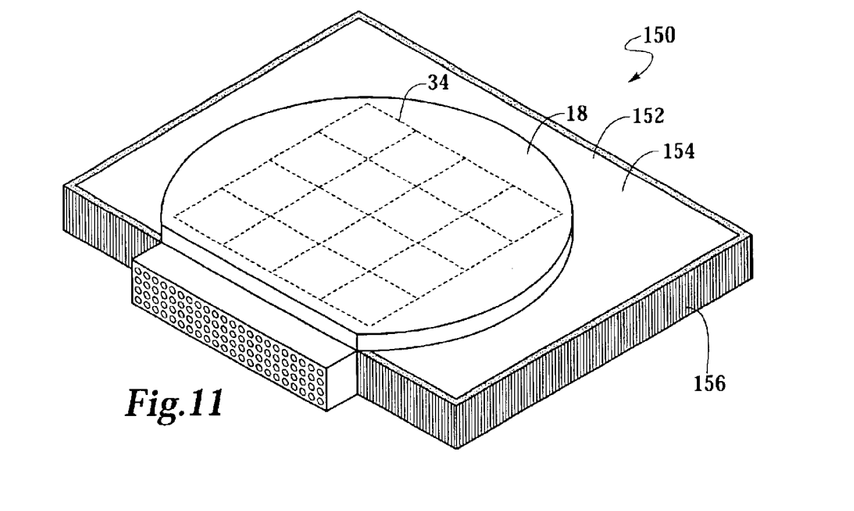
FIG. 11 is an isometric view of a wafer-interposer assembly of the present invention having a cushioning member to improve the handling of the wafer.

Now referring to FIG. 11, a wafer-interposer assembly of the present invention is depicted and generally designated 150. Wafer-interposer assembly 150 includes a wafer interposer 152 and a wafer 18 that is electrically and mechanically attached thereto as explained above. Wafer interposer 152 includes a wafer receiving portion onto which wafer 18 has been positioned and a handling portion 154 that extends outwardly from the wafer receiving portion such that handling portion 154 is accessible without contacting wafer 18. In the illustrated embodiment, handling portion 154 is surrounded by a cushioning member 156 that absorbs impacts to wafer-interposer assembly 150, thereby minimizing shock to or vibration of wafer 18.

Figure 12:
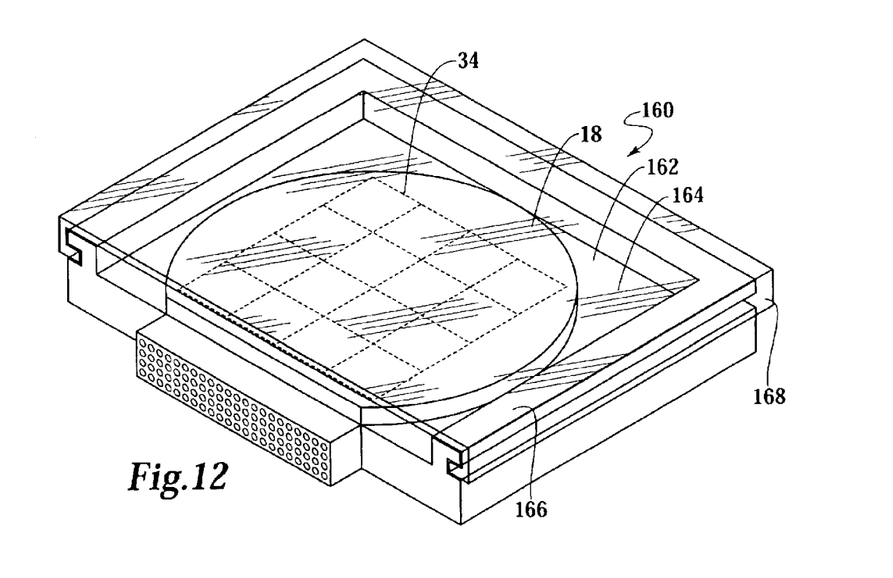
FIG. 12 is an isometric view of a wafer-interposer assembly of the present invention having a cover to improve the handling of the wafer.

Referring next to FIG. 12, a wafer-interposer assembly of the present invention is depicted and generally designated 160. Wafer-interposer assembly 160 includes a wafer interposer 162 and a wafer 18 that is electrically and mechanically attached thereto as explained above. Wafer interposer 162 includes a wafer receiving portion onto which wafer 18 has been positioned and a handling portion 164 that extends outwardly from the wafer receiving portion such that handling portion 164 is accessible without contacting wafer 18. In the illustrated embodiment, handling portion 164 includes a ledge 166 onto which a cover 168 may be attached. Cover 168 encloses wafer 18 thereunder to protect wafer 18 and allow for stacking of like wafer-interposer assemblies 160 on one another. It should be noted that cover 168 could alternatively provide a hermetic seal around wafer 18 which would increase the shelf like of wafer 18.

While numerous examples of wafer-interposer assemblies have been described, it should be understood by those skilled in the art that elements of the various embodiments could be combined into one embodiment of a wafer-interposer assembly without departing from the principles of the present invention. For example, slots 46 and 48 of interposer 42 from FIG. 2 could be combined with holes 76, 78, 80 and 82 of interposer 72 from FIG. 4 or with locking members 116 and release members 118 of interposer 102 from FIG. 6. In a like manner, stiffening members 126, 128 and 130 of interposer 122 from FIG. 8 could be combined with cushioning member 156 of interposer 152 from FIG. 10 or with ledge 166 and cover 168 of interposer 162 from FIG. 11. All such combinations and permutations are contemplated herein and are considered within the scope of the present invention. Additionally, it should be understood by those skilled in the art that while the illustrated embodiments have depicted the wafer interposers as being substantially rectangular, other shaped wafer interposers including square, round, wafer shaped or otherwise are considered within the scope of the present invention.

Referring next to FIG. 12, therein is depicted an array 170 of chip assemblies 172 after singulation of a wafer-interposer assembly of the present invention. Each chip assembly 172 comprises a chip 174 from a wafer, a section 176 of an interposer and a plurality of conductive attachment elements 178 disposed on conductive contact pads on the lower surface of chip assemblies 172. As should be apparent to those skilled in the art, the handling portion of the interposer is separated from the chip assemblies 172 prior to or during singulation.

Figure 13:
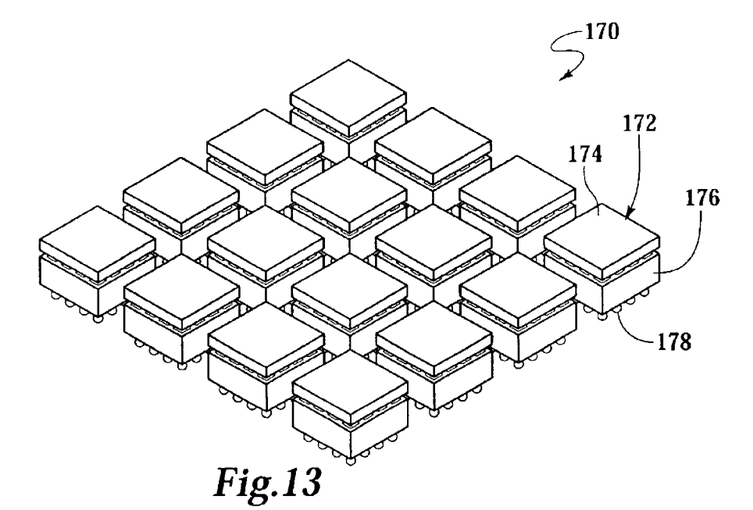
FIG. 13 is an isometric view of a plurality of chip assemblies after singulation of a wafer-interposer assembly of the present invention.
Figure 14:
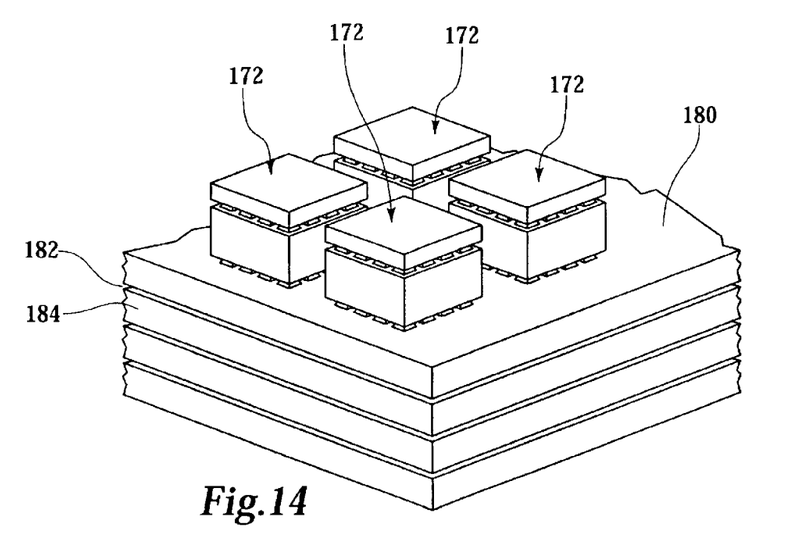
FIG. 14 is an isometric view of four chip assemblies of the present invention in place on a substrate.

As best seen in FIG. 13, one or more chip assemblies 172 may be mounted together on a substrate 180. Substrate 180 has a plurality of conductive layers 182 and dielectric layers 184. Chip assemblies 172 are electrically and mechanically attached to contact pads on the surface of substrate 180 through conductive attachment elements 178. Assembled as shown, the diced sections 176 of the interposer provide electrical connection between chips 174 and substrate 180.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for constructing a wafer-interposer assembly comprising the steps of:
   providing a wafer having a plurality of integrated circuit chips each having a plurality of contact pads; and
   connecting the wafer to a wafer receiving portion of a wafer interposer to form a wafer-interposer assembly by electrical and non-temporary mechanical connection of at least some of the contact pads of the integrated circuit chips with contact pads of the wafer receiving portion, the wafer interposer having a handling portion extending outwardly from the wafer receiving portion.

2. The method as recited in claim 1 further comprising the step of magnetically accessing the wafer-interposer assembly via at least one magnet operably associated with the handling portion of the wafer interposer.

3. The method as recited in claim 1 further comprising the step of securably coupling to the wafer-interposer assembly via at least one locking member operably associated with the handling portion of the wafer interposer.

4. The method as recited in claim 1 further comprising the step of disposing at least one stiffening member within the handling portion of the wafer interposer.

5. The method as recited in claim 1 further comprising the step of moving the wafer-interposer assembly using a set of bearings in the handling portion of the wafer interposer.

6. The method as recited in claim 1 further comprising the step of disposing a cushioning member around at least part of the handling portion of the wafer interposer.

7. The method as recited in claim 1 further comprising the step of removably attaching a cover to the handling portion of the wafer interposer that extends across the wafer receiving portion.

8. The method as recited in claim 1 further comprising the step of testing the integrated circuit chips of the wafer without contacting the integrated circuit chips.

9. A method for reducing the likelihood of damaging a wafer during handling comprising the steps of:
   providing a wafer having a plurality of integrated circuit chips each having a plurality of contact pads;
   connecting the wafer to a wafer receiving portion of a wafer interposer to form a wafer-interposer assembly by electrical and non-temporary mechanical connection of at least some of the contact pads of the integrated circuit chips with contact pads of the wafer receiving portion; and
   accessing a handling portion of the wafer interposer that is operably associated with the wafer receiving portion without contacting the wafer.

10. The method as recited in claim 9 wherein the step of accessing the handling portion of the wafer interposer without contacting the wafer further comprises accessing at least one slot operably associated with the handling portion of the wafer interposer.

11. The method as recited in claim 9 wherein the step of accessing the handling portion of the wafer interposer without contacting the wafer further comprises accessing at least one hole operably associated with the handling portion of the wafer interposer.

12. The method as recited in claim 9 wherein the step of accessing the handling portion of the wafer interposer without contacting the wafer further comprises accessing at least one receiving member operably associated with the handling portion of the wafer interposer.

13. The method as recited in claim 9 wherein the step of accessing the handling portion of the wafer interposer without contacting the wafer further comprises accessing at least one magnet operably associated with the handling portion of the wafer interposer.

14. The method as recited in claim 9 wherein the step of accessing the handling portion of the wafer interposer without contacting the wafer further comprises securably coupling to the wafer-interposer assembly via at least one locking member operably associated with the handling portion of the wafer interposer.

15. The method as recited in claim 9 further comprising the step of disposing at least one stiffening member within the handling portion of the wafer interposer.

16. The method as recited in claim 9 further comprising the step of moving the wafer-interposer assembly using a set of bearings in the handling portion of the wafer interposer.

17. The method as recited in claim 9 further comprising the step of disposing a cushioning member around at least part of the handling portion of the wafer interposer.

18. The method as recited in claim 9 further comprising the step of removably attaching a cover to the handling portion of the wafer interposer that extends across the wafer receiving portion.

19. The method as recited in claim 9 further comprising the step of testing the integrated circuit chips of the wafer without contacting the integrated circuit chips.

20. A method for constructing chip assemblies comprising the steps of:
   providing a wafer having a plurality of integrated circuit chips each having a plurality of contact pads;
   connecting the wafer to a wafer receiving portion of a wafer interposer to form a wafer-interposer assembly by electrical and non-temporary mechanical connection of at least some of the contact pads of the integrated circuit chips with contact pads of the wafer receiving portion;
   accessing a handling portion of the wafer interposer that extends outwardly from the wafer receiving portion without contacting the wafer;

separating the handling portion of the wafer interposer from the wafer interposer; and singulating the wafer-interposer assembly into a plurality of chip assemblies, each chip assembly including at least one of the integrated circuit chips and a portion of the water interposer.

21. The method as recited in claim 20 wherein the step of separating the handling portion occurs prior to the step of singulating the wafer-interposer assembly.

22. The method as recited in claim 20 wherein the step of separating the handling portion occurs substantially simultaneously with the step of singulating the wafer-interposer assembly.

23. The method as recited in claim 20 further comprising the step of mounting at least one of the chip assemblies on a substrate.

24. The method as recited in claim 20 wherein the step of accessing the handling portion of the water interposer without contacting the wafer further comprises accessing at least one slot operably associated with the handling portion of the wafer interposer.

25. The method as recited in claim 20 wherein the step of accessing the handling portion of the wafer interposer without contacting the wafer further comprises accessing at least one hole operably associated with the handling portion of the wafer interposer.

26. The method as recited in claim 20 wherein the step of accessing the handling portion of the wafer interposer without contacting the wafer further comprises accessing at least one receiving member operably associated with the handling portion of the wafer interposer.

* * * * *